(12) United States Patent
Zhu et al.

(10) Patent No.: US 11,769,979 B2
(45) Date of Patent: Sep. 26, 2023

(54) ON-CHIP ULTRA-NARROW LINEWIDTH LASER AND METHOD FOR OBTAINING SINGLE-LONGITUDINAL MODE ULTRA-NARROW LINEWIDTH OPTICAL SIGNAL

(71) Applicant: CHONGQING UNIVERSITY, Chongqing (CN)

(72) Inventors: Tao Zhu, Chongqing (CN); Ligang Huang, Chongqing (CN); Lei Gao, Chongqing (CN); Guolu Yin, Chongqing (CN)

(73) Assignee: Chongqing University, Chongqing (CN)

( * ) Notice: Subject to any disclaimer, the term of this patent is extended or adjusted under 35 U.S.C. 154(b) by 178 days.

(21) Appl. No.: 16/952,058

(22) Filed: Nov. 18, 2020

(65) Prior Publication Data
US 2021/0159658 A1 May 27, 2021

(30) Foreign Application Priority Data
Nov. 22, 2019 (CN) .......................... 201911156447.7

(51) Int. Cl.
*H01S 3/067* (2006.01)
*H01S 3/094* (2006.01)
(Continued)

(52) U.S. Cl.
CPC ...... *H01S 3/0675* (2013.01); *H01S 3/094042* (2013.01); *H01S 3/1608* (2013.01); *H01S 3/302* (2013.01); *H01S 2301/163* (2013.01)

(58) Field of Classification Search
CPC ............. H01S 3/0675; H01S 3/094042; H01S 3/1608; H01S 3/302; H01S 2301/163;
(Continued)

(56) References Cited

U.S. PATENT DOCUMENTS 5,323,404 A * 6/1994 Grubb .................. H01S 3/0675
359/345
5,699,377 A * 12/1997 Pan ...................... G02B 6/4215
372/18
(Continued)

FOREIGN PATENT DOCUMENTS

| CN | 102354900 A | 2/2012 |
| CN | 107181166 A | 9/2017 |
| CN | 109672080 A | 4/2019 |

*Primary Examiner* — Xinning(Tom) Niu

(57) ABSTRACT

An on-chip ultra-narrow linewidth laser and a method for obtaining a single-longitudinal mode ultra-narrow linewidth optical signal are provided in the present invention. The on-chip ultra-narrow linewidth laser includes a laser generating gain unit for generating a broad-spectrum initial optical signal and performing wavelength filtering on the generated optical signal, and also includes a distributed scattering feedback unit for performing linewidth compression on the optical signal; the laser generating gain unit is connected with the distributed scattering feedback unit, so that the optical signal generated by the laser generating gain unit is subjected to wavelength filtering and then output to the light guide component of the distributed scattering feedback unit to scatter to form an optical signal with a narrower linewidth to achieve linewidth compression, and the optical signal returning along the original path and fed back to the optical signal of the laser generating gain unit is subjected to gain amplification and wavelength filtering once again, repeating until achieving a steady state so as to obtain a single-longitudinal mode ultra-narrow linewidth optical signal. The laser can obtain a steady single-longitudinal mode ultra-narrow linewidth optical signal, and is simple in structure and small in volume.

14 Claims, 11 Drawing Sheets

(51) Int. Cl.
*H01S 3/16* (2006.01)
*H01S 3/30* (2006.01)

(58) Field of Classification Search
CPC .... H01S 5/005; H01S 5/0064; H01S 2301/02; H01S 5/0654; H01S 5/141; H01S 5/146; H01S 5/12; H01S 5/1032; H01S 3/0085; H01S 3/0057; H01S 3/067
See application file for complete search history.

(56) References Cited

U.S. PATENT DOCUMENTS

| | | | | |
|---|---|---|---|---|
| 6,430,207 | B1* | 8/2002 | Alphonse | H01L 33/0045 |
| | | | | 372/98 |
| 8,885,677 | B1* | 11/2014 | Kupershmidt | H01S 5/141 |
| | | | | 372/28 |
| 10,641,959 | B1* | 5/2020 | Park | G02B 6/1228 |
| 2004/0131093 | A1* | 7/2004 | Waarts | H01S 5/065 |
| | | | | 372/22 |
| 2006/0140228 | A1* | 6/2006 | McDonald | H01S 5/141 |
| | | | | 372/20 |
| 2007/0086500 | A1* | 4/2007 | Miyazaki | H01S 5/026 |
| | | | | 372/50.1 |
| 2010/0303121 | A1* | 12/2010 | Alalusi | H01S 5/141 |
| | | | | 372/92 |
| 2011/0134951 | A1* | 6/2011 | Ryvkin | H01S 5/2031 |
| | | | | 372/45.01 |

* cited by examiner

ON-CHIP ULTRA-NARROW LINEWIDTH LASER AND METHOD FOR OBTAINING SINGLE-LONGITUDINAL MODE ULTRA-NARROW LINEWIDTH OPTICAL SIGNAL

RELATED APPLICATION

The application claims the benefit of the Chinese Patent Application CN201911156447.7 filed Nov. 22, 2019, which is incorporated herein by reference in its entirety.

FIELD OF THE INVENTION

The present invention relates to the field of laser linewidth compression. More particularly, this invention relates to an on-chip ultra-narrow linewidth laser and a method for obtaining a single-longitudinal-mode ultra-narrow linewidth optical signal.

BACKGROUND OF THE INVENTION

An ultra-narrow linewidth laser operating in a single longitudinal mode has important application prospects in the fields of optical fiber sensing, optical fiber communication, lidar and gravitational wave detection due to its ultralong coherence length and extremely low phase noise. While the single-longitudinal-mode operation of laser is a preconditioning foundation for realizing laser linewidth compression. So far, in addition to a short cavity structure, a saturable absorber and other mode selection methods, external cavity optical feedback has become a common method for obtaining laser linewidth narrowing. For example, Chinese patent CN201710530248.2 is based on an external cavity self-feedback narrow linewidth semiconductor laser. The laser includes a semiconductor gain chip for generating optical gain; a fiber Bragg grating, which is directly coupled to the gain chip and used for feeding back light generated by the gain chip; an optical beam splitter, used for splitting the light in a certain proportion; an optical circulator, connected with the fiber Bragg grating or optical beam splitter by a mode of optical fiber coupling and used for external self-feedback of the light output from the fiber Bragg grating; and a tunable optical attenuator, located in the feedback loop of the optical circulator and used for continuously tuning the attenuation of the feedback intensity.

However, the above-mentioned laser adopts optical power feedback based on a fixed cavity, which mainly achieves narrowing of the laser linewidth by increasing the length of a feedback cavity. In this process, it faces three main problems: 1) because the introduced extra cavity length will reduce the free spectral range (FSR) under the same conditions, it is difficult to realize the single-longitudinal-mode operation of the laser; 2), because it is only a kind of power feedback, the limited feedback cavity length will limit the further compression of the linewidth; and 3) it is difficult to realize the integration and miniaturization of the laser by increasing the feedback cavity length to achieve the narrowing of the laser linewidth.

OBJECTS AND SUMMARY OF THE INVENTION

The present invention provides an on-chip ultra-narrow linewidth laser and a method for obtaining a single-longitudinal mode ultra-narrow linewidth optical signal, so as to solve the problem that it is difficult for a traditional optical feedback method adopted in the field of narrow linewidth lasers to achieve laser linewidth deep compression while obtaining mode selection; meanwhile, the invention overcomes the problem that it is difficult to realize the integration and miniaturization of the laser by increasing the length of the feedback cavity to realize the narrowing of the laser line width.

A technical scheme adopted by the invention is:

An on-chip ultra-narrow linewidth laser, including a laser generating gain unit for generating a broad-spectrum initial optical signal and performing wavelength filtering on the generated optical signal, and also including a distributed scattering feedback unit for performing linewidth compression on the optical signal; the distributed scattering feedback unit includes a light guide component with scattering characteristics and a shielding component wrapping the light guide component so that the optical signal propagates in a predetermined direction in the light guide component; and the laser generating gain unit is connected with the distributed scattering feedback unit, so that the optical signal generated by the laser generating gain unit is subjected to wavelength filtering and then output to the light guide component of the distributed scattering feedback unit to scatter to form an optical signal with a narrower linewidth to achieve linewidth compression, and the optical signal returning along the original path and fed back to the laser generating gain unit is subjected to gain amplification and wavelength filtering once again, repeating until achieving a steady state so as to obtain a single-longitudinal-mode ultra-narrow linewidth optical signal.

As an improvement, the distributed scattering feedback unit is an optical fiber with a scattering mechanism; and the optical fiber includes a fiber core and a cladding for wrapping the fiber core. When the optical signal emitted by the laser generating gain unit is injected into the optical fiber waveguide, a distributed feedback signal represented by Rayleigh scattering is generated, and the feedback signal has a narrower linewidth than the initial incident signal. The generated backscattered signal will return along the original path and is fed back to the laser generating gain unit, thereby realizing a light feedback with distributed feedback characteristics.

Preferably, the optical fiber is one of a single-mode optical fiber, a multi-mode optical fiber, a doped optical fiber, and a high-numerical-aperture optical fiber. According to the present invention, the scattering mechanism of a quartz fiber is mainly used for compressing the linewidth of the optical signal.

As an improvement, the distributed scattering feedback unit is an integrated waveguide component with a scattering mechanism; the integrated waveguide component includes a substrate, and the substrate is covered with a dielectric film and a covering layer from bottom to top; and the refractive indices of the dielectric film, the substrate and the covering layer are sequentially reduced. When the light emitted by the laser generating gain unit is injected into the integrated waveguide component, it will generate a distributed feedback signal represented by Rayleigh scattering, and the feedback signal has a narrower linewidth than the initial incident signal. The generated backscattered signal will return along the original path and be fed back to the laser generating gain unit, thereby realizing a light feedback with distributed feedback characteristics.

Preferably, the substrate is a silicon-based or gallium arsenide substrate, and is engraved into an integrated waveguide component by utilizing a femtosecond processing technology.

As an improvement, the laser generating gain unit includes a pump source, a resonant cavity and a gain medium; and the gain medium is arranged in the resonant cavity. The pump source is used for exciting the gain medium in the resonant cavity, so that stimulated radiation photons cyclically and reciprocally move in the resonant cavity to realize the formation and amplification of laser, and the wavelength is selected by the filter.

As an improvement, the resonant cavity includes a first reflector and a second reflector; the first reflector and the second reflector are parallel to each other and are corresponding in position; and the gain medium is arranged between the first reflector and the second reflector. The two reflectors are adopted as the resonant cavity, so that the stimulated radiation photons cyclically and reciprocally move in the resonant cavity to realize the formation and amplification of laser, and are finally transmitted out by the reflector at one terminal.

As an improvement, the pump source is a pump light source, and an optical signal emitted by the pump light source is perpendicular to the first reflector and the second reflector. The optical signal of the pump light source provides energy, to achieve population inversion and provide an environment for the amplification of the optical signal.

As an improvement, the gain medium is an optical fiber doped with rare earth elements. The rare earth element is $Er^{+3}$ or $Yi^+$. The optical fiber is used as a gain medium mainly for providing gain for fiber lasers. The wavelength output by the laser depends on the types of doped elements, laser with different wavelengths is produced by doping with different rare earth elements.

As an improvement, an interval between the first reflector and the second reflector is greater than a gain bandwidth provided by the gain medium. The length of the resonant cavity determines an interval between two adjacent laser longitudinal modes, while the gain medium itself provides gain bandwidth with a fixed length. As long as the interval between the longitudinal modes is much greater than the gain bandwidth, it can be guaranteed that only one longitudinal mode can oscillate in the gain bandwidth.

As an improvement, the gain medium is a semiconductor gain unit; the semiconductor gain unit includes a P-type layer, a P-N-type layer and an N-type layer from top to bottom; the P-type layer is connected to the positive electrode of the pump source, and the N-type layer is connected to the negative electrode of the pump source. An electrical signal is used as the pump source to provide energy to realize the population inversion, so that the laser signal is generated in the P-N junction and amplified. The semiconductor gain unit is made of one out of gallium arsenide, cadmium sulfide, indium phosphide and zinc sulfide by adopting a doping method. The wavelength output by laser depends on the type of semiconductor material and operating temperature, and different types of semiconductors produce lasers of different wavelengths.

As an improvement, the gain medium is linear, and a fiber Bragg grating is engraved on the underside of the gain medium. Electrical excitation produces a wide-spectrum laser output, but the working medium is engraved with fiber Bragg grating (FBG). The fiber grating functions as a filter, which only allows the light in a specific longitudinal mode position to pass, and thus realizing transformation from multiple longitudinal modes to single longitudinal modes.

As an improvement, the on-chip ultra-narrow linewidth laser also includes a first light collimating lens and a second light collimating lens. The first output terminal of the laser generating gain unit is connected to the first terminal of the distributed scattering feedback unit through the first light collimating lens, and the second output terminal of the laser generating gain unit is connected to the first terminal of the second light collimating lens. With the collimating lens, the optical signal is transmitted between the laser generating gain unit and the distributed scattering feedback unit, and the laser output at the first output terminal of the laser generating gain unit is realized.

As an improvement, the second terminal of the second light collimating lens is connected to a first optical isolator, or/and, the second terminal of the distributed scattering feedback unit is connected to a second optical isolator. Therefore, stable single-terminal output of a single-longitudinal-mode ultra-narrow linewidth optical signal is achieved.

As an improvement, the second terminal of the distributed scattering feedback unit is connected to a second optical isolator. Therefore, stable single-terminal output of a single-longitudinal mode ultra-narrow linewidth optical signal is achieved.

As an improvement, the second terminal of the second light collimating lens is connected to a first optical isolator, or/and, the second terminal of the distributed scattering feedback unit is connected to a second optical isolator. Therefore, stable double-terminal output of a single-longitudinal mode ultra-narrow linewidth optical signal is achieved.

As an improvement, the laser generating gain unit, the distributed scattering feedback unit, the first light collimating lens and the second light collimating lens are integrated on a substrate, to achieve integration of the laser and reduce the volume.

The present invention also provides a method for obtaining a single-longitudinal-mode ultra-narrow linewidth optical signal, including the following steps:

S1: generating a broad-spectrum initial optical signal and performing wavelength filtering on the generated optical signal;

S2: performing linewidth compression on the screened optical signal;

S3: performing gain amplification and filtering on the compressed optical signal;

S4: performing linewidth compression on the optical signal after gain amplification and filtering once again; and S5: repeating steps S3-S4 until reaching a steady state, so as to obtain a single-longitudinal-mode ultra-narrow linewidth optical signal.

Preferably, in S1, the pump light source excites an optical fiber to generate the optical signal, and a resonant cavity greater than the gain bandwidth is set to screen the optical signal; or an electrical signal excites a semiconductor to generate an optical signal, and the semiconductor is engraved with FBG to screen the optical signal.

Preferably, in S2, an optical fiber with scattering characteristics scatters the optical signal to form an optical signal with narrower linewidth to achieve linewidth compression; or an integrated waveguide component scatters the optical signal to form an optical signal with narrower linewidth to achieve linewidth compression.

The present invention has the following beneficial effects:

1. According to the present invention, the on-chip ultra-narrow linewidth laser is provided with a laser generating gain unit, a distributed scattering feedback unit, a first light collimating lens and a second light collimating lens, and before an optical signal is transmitted to the distributed scattering feedback unit to perform cyclic linewidth compression, the laser generating gain unit first selects an optical signal with specific wavelength, and then transmits the optical signal with specific wavelength to the distributed scattering feedback unit to perform cyclic linewidth compression, thereby increasing the compression efficiency; and the distributed scattering feedback unit is arranged to achieve self-matching of output wavelength and an effective feedback cavity, so as to achieve laser linewidth deep compression during mode selection, and obtain single-longitudinal-mode output with relatively high side-mode suppression rate, moreover, the whole laser is simple in structure and small in volume.

2. According to the present invention, by selectively arranging a first optical isolator and a second optical isolator, stable single-terminal output or stable double-terminal output of a single-longitudinal-mode ultra-narrow linewidth optical signal may be achieved.

3. According to the present invention, corresponding components are integrated on the substrate, thereby realizing integration and stabilization.

Figure 1:
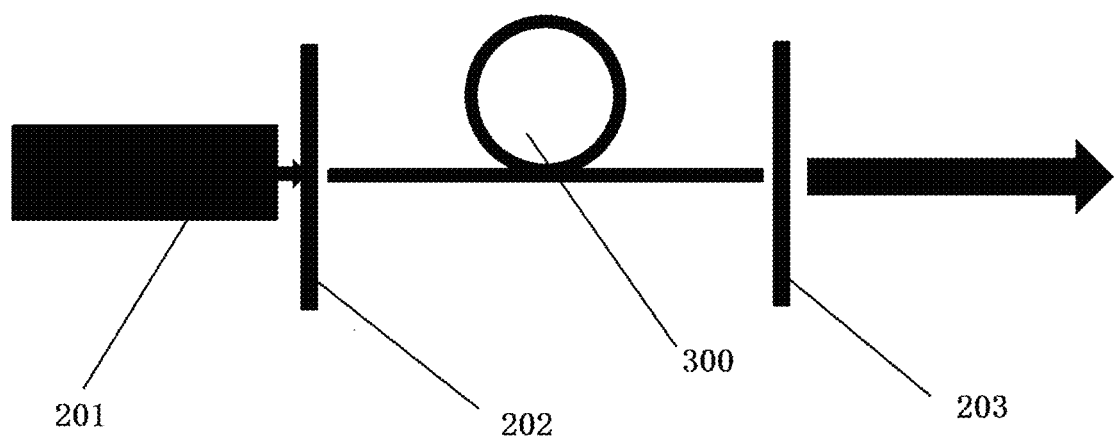
FIG. 1 is a schematic structure diagram of an optical fiber type laser gain unit.

In the drawings, 1: distributed scattering feedback unit; 2: first light collimating lens; 3: laser generating gain unit; 4: second light collimating lens; 5: first optical isolator; 6: baseplate; 7: second optical isolator.

101: fiber core; 102: cladding; 103: injected optical signal; 4: scattering feedback signal; 111: substrate; 112: dielectric layer; 113: covering layer.

201: pump source; 202: first reflector; 203: second reflector; 211: P-type layer; 212: P-N-type layer; 213: N-type layer.

300: gain medium; 301: fiber Bragg grating.

DETAILED DESCRIPTION OF THE EMBODIMENTS

To make a person skilled in the art to better understand the technical scheme in embodiments of the present invention and make the foregoing objectives, features and advantages of embodiments of the present invention more comprehensible, the technical scheme in the embodiment of the present invention is further described in details below with reference to the accompanying drawings.

In descriptions of the present invention, unless otherwise specified and limited, it should be noted that the term "connection" should be understood in a broad sense, for example, it may be mechanical connection or electrical connection, or may be internal communication of two components, may be direct connection, or may be indirect connection through an intermediary. For those of ordinary skill in the art, the specific meanings of the above-mentioned term may be understood according to specific circumstances.

The present invention provides an on-chip ultra-narrow linewidth laser, including a laser generating gain unit 3 for generating a broad-spectrum initial optical signal and performing wavelength filtering on the generated optical signal, and also comprising a distributed scattering feedback unit 1 for performing linewidth compression on the optical signal; the distributed scattering feedback unit 1 includes a light guide component with scattering characteristics and a shielding component wrapping the light guide component so that the optical signal propagates in a predetermined direction in the light guide component; in general, the refractive index of the shielding component is lower than that of the light guide component. The laser generating gain unit 3 is connected with the distributed scattering feedback unit 1, so that the optical signal generated by the laser generating gain unit 3 is subjected to wavelength filtering and then output to the light guide component of the distributed scattering feedback unit 1 to scatter to form an optical signal with a narrower linewidth to achieve linewidth compression, and the optical signal returning along the original path and fed back to the optical signal of the laser generating gain unit 3 is subjected to gain amplification and wavelength filtering once again, repeating until achieving a steady state so as to obtain a single-longitudinal mode ultra-narrow linewidth optical signal.

The laser generating gain unit 3 is used for generating a broad-spectrum initial optical signal, and performing wavelength filtering on the generated optical signal, so as to obtain an optical signal with specific wavelength. The laser generating gain unit 3 structurally includes a pump source 201, a resonant cavity and a gain medium 300; and the gain medium 300 is arranged in the resonant cavity. Specifically, the resonant cavity includes a first reflector 202 and a second reflector 203; the first reflector 202 and the second reflector 203 are parallel to each other and are corresponding in position; and the gain medium 300 is arranged between the first reflector 202 and the second reflector 203.

An optical fiber type laser gain unit and a semiconductor type laser gain unit may be selected as the laser generating gain unit 3.

The optical fiber type laser gain unit mainly provides gain for a fiber laser, with a structure as shown in FIG. 1, and a 980 nm pump light source is selected as the pump source 201. An optical signal emitted by the pump light source is perpendicular to the first reflector 202 and the second reflector 203. The gain medium 300 is optical fiber doped with rare earth elements, and may be doped with the rare earth element such as $Er^{+3}$ or $Yi^+$ according to required laser. In order to obtain a single-longitudinal mode optical signal, an interval between the first reflector 202 and the second reflector 203 is greater than a gain bandwidth provided by the gain medium 300. The principle is that the optical signal emitted by the pump light source provides energy, to achieve population inversion and provide an environment for the amplification of the optical signal; and two reflectors are adopted as the resonant cavity, so that the stimulated radiation photons cyclically and reciprocally move in the resonant cavity to realize the formation and amplification of laser, and are finally transmitted out by a reflector (namely, the first reflector 202 or the second reflector 203) at one terminal.

Figure 2:
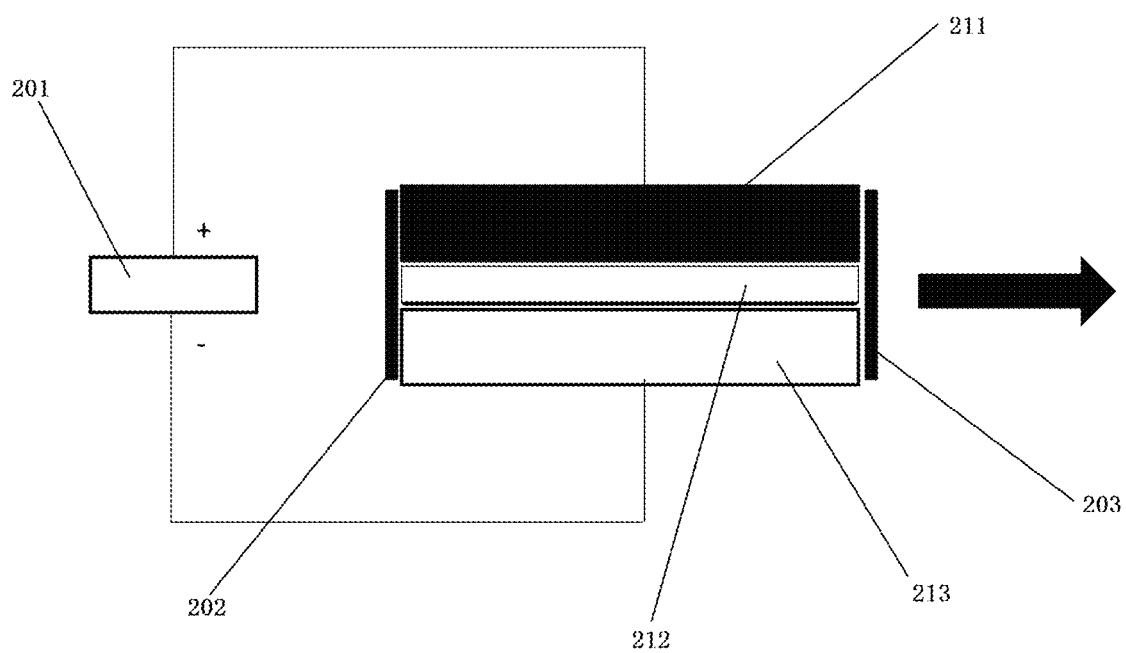
FIG. 2 is a schematic structure diagram of a semiconductor type laser gain unit.

The semiconductor type laser gain unit refers to a laser gain unit taking a semiconductor material as a gain medium 300, and the semiconductor gain unit is made of one out of gallium arsenide, cadmium sulfide, indium phosphide and zinc sulfide by adopting a doping method. With the structure as shown in FIG. 2, the semiconductor gain unit includes a P-type layer 211, a P-N-type layer 212 and an N-type layer 213 from top to bottom; the P-type layer 211 is connected to the positive electrode of the pump source 201, and the N-type layer 213 is connected to the negative electrode of the pump source 201. The first reflector 202 and the second reflector 203 are arranged at two ends of the semiconductor gain unit. An electrical signal is used as the pump source 201 to provide energy to realize the population inversion, so that the laser signal is generated in a P-N-type layer 212 and amplified; and the stimulated radiation photons cyclically and reciprocally move between the first reflector 202 and the second reflector 203 to realize the formation and amplification of laser, and are finally transmitted out by a reflector (namely, the first reflector 202 or the second reflector 203) at one terminal at one terminal.

The gain medium 300 of the semiconductor type laser gain unit is preferably linear, and an FBG (fiber Bragg grating) is engraved on the underside of the gain medium 300 to be taken as a filter. The gain medium 300 generates a broad-spectrum initial optical signal under the exciting effect of the pump source 201, a generated optical signal is transmitted to the FBG 301 which performs wavelength filtering on the generated optical signal to obtain an optical signal with specific wavelength, one portion of the optical signal with specific wavelength is transmitted to the distributed scattering feedback unit 1 by a first output terminal, and the other portion passes through a second output terminal; and the first terminal of the distributed scattering feedback unit 1 transmits the optical signal fed back backward after linewidth compression to the gain medium 300 by the FBG 301 after receiving the optical signal with specific wavelength and performing linewidth compression on the optical signal, the gain medium 300 performs gain amplification on the feedback optical signal after receiving the feedback optical signal, and one portion of the optical signal after gain amplification is output from a second output terminal by the FBG 301, and the other portion is transmitted to the first terminal of the distributed scattering feedback unit 1 again by the FBG 301 for further linewidth compression. The gain medium 300 of the laser generating gain unit 3 may cover any waveband of laser gain, without wavelength selectivity, and is applicable to deep compression of laser linewidth of any waveband and any type.

Before transmitting the optical signal to the distributed scattering feedback unit 1 for cyclic linewidth compression, the laser generating gain unit 3 first selects an optical signal with specific wavelength, and then transmits the optical signal with specific wavelength to the distributed scattering feedback unit 1 to perform cyclic linewidth compression, thereby increasing the compression efficiency; and the distributed scattering feedback unit is arranged to achieve self-matching of output wavelength and an effective feedback cavity, so as to achieve laser linewidth deep compression during mode selection, and obtain single-longitudinal mode output with relatively high side-mode suppression rate, moreover, the whole laser is simple in structure and small in volume.

It should be noted that: there is usually an extra isolator at a laser output position inside existing optical fiber type laser gain unit and semiconductor type laser gain unit. The present invention is technically implemented on the premise of requiring the optical signal in the distributed scattering feedback unit to be capable of returning to the laser generating gain unit, and therefore, it is required in the present patent that there cannot be any isolation between the laser generating gain unit and the distributed scattering feedback unit.

The optical signal fed back and transmitted by the distributed scattering feedback unit is a distributed scattering feedback signal covering Rayleigh scattering characteristics, and self-matching of laser wavelength and an effective distributed feedback cavity is realized by the distributed scattering feedback unit. Self-cavity length matching and no-longitudinal mode output of laser wavelength are achieved by a backward feedback signal generated by the distributed scattering feedback unit, and influences of other nonlinear effects to laser linewidth compression may be avoided by designing the structure of the distributed scattering feedback unit. Because the distributed scattering feedback unit 1 represented by Rayleigh scattering generates a backward scattering signal with frequency domain linewidth narrower than that of an originally injected signal in each time of laser oscillating and feeds back to the laser generating gain unit 3 for gain amplification, deep compression of laser linewidth can be realized.

The distributed scattering feedback unit 1 may be an optical fiber or integrated waveguide component with scattering characteristics and structurally includes a light guide component and a shielding component. The light guide component has scattering characteristics, and is capable of scattering an optical signal transmitted along the light guide component to obtain an optical signal with narrower linewidth, while the shielding component can guarantee that the optical signal propagates in a predetermined direction, and thus ensuring that one portion of scattered light signal can return to the laser generating gain unit 3.

Figure 3:
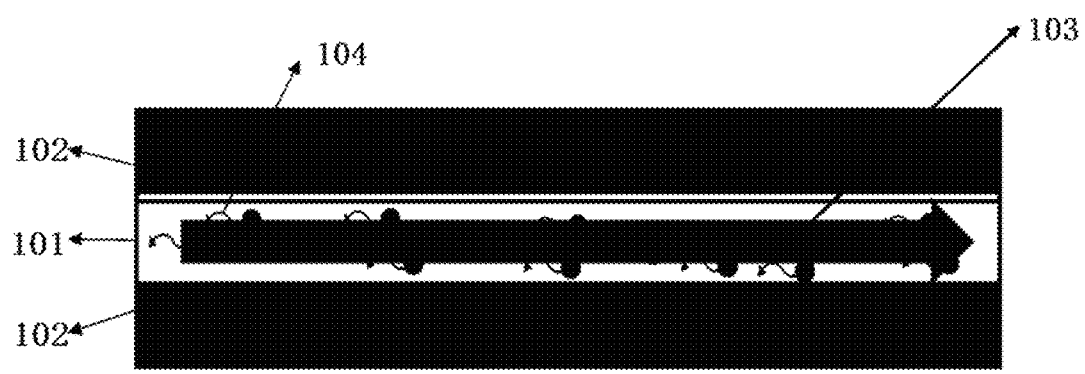
FIG. 3 is a schematic structure diagram of an optical fiber based distributed scattering feedback unit.

The structure of an optical fiber based distributed scattering feedback unit is as shown in FIG. 3, including a fiber core 101 (the light guide component) and a cladding 102 (the shielding component) for wrapping the fiber core. Specifically, the optical fiber may be selected from one out of single-mode optical fiber, multi-mode optical fiber, doped optical fiber, and high-numerical aperture optical fiber. Actually, any silica fiber with a scattering mechanism may be taken as the distributed scattering feedback unit 1. When an injected optical signal 103 emitted by the laser generating gain unit 3 is injected into the fiber core 101 of the optical fiber, a distributed feedback signal represented by Rayleigh scattering will be generated, and the feedback signal has a narrower linewidth than the initial incident signal. The generated backscattered feedback signal 104 will return along the original path and is fed back to the laser generating gain unit 3, thereby realizing a light feedback with distributed feedback characteristics.

Figure 4:
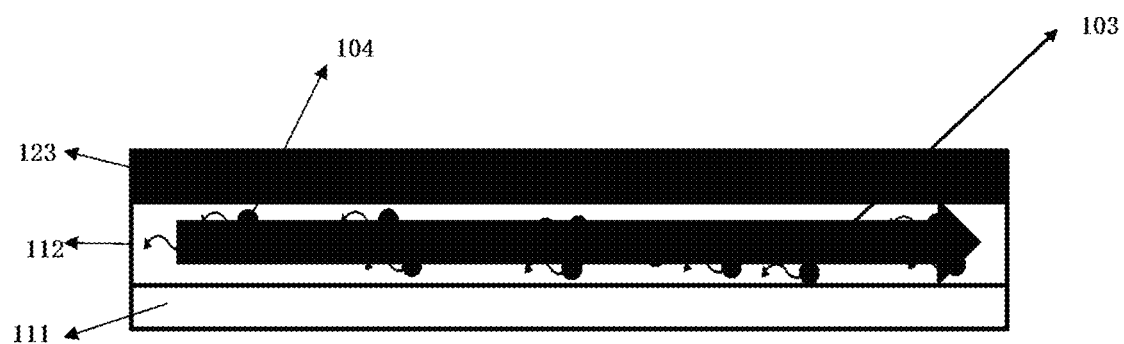
FIG. 4 is a schematic structure diagram of an integrated waveguide based distributed scattering feedback unit.

The structure of an integrated waveguide based distributed scattering feedback unit 1 is as shown in FIG. 4, including a substrate 111, and the substrate 111 is covered with a dielectric film 112 and a covering layer 113 from bottom to top; and the refractive indexes of the dielectric film 112, the substrate 111 and the covering layer 113 are sequentially reduced. The dielectric film 112 is a light guide component while the substrate 111 and the covering layer 113 are both shielding components. The substrate 113 is a silicon substrate or gallium arsenide, and is engraved into an integrated waveguide component by utilizing a femtosecond processing technology. Similarly, when an injected optical signal 104 emitted by the laser generating gain unit 3 is injected into the integrated waveguide junction component, a distributed feedback signal represented by Rayleigh scattering will be generated, and the feedback signal has a narrower linewidth than the initial incident signal. The generated backscattered feedback signal 104 will return along the original path and is fed back to the laser generating gain unit 3, thereby realizing a light feedback with distributed feedback characteristics.

According to the present invention, by taking that a Rayleigh scattering unit represented by Rayleigh scattering implements laser linewidth deep compression as an example, the principle may be interpreted as:

$$S_{L\text{-}out}^{k}(\omega) = R\varepsilon_2(1-R_2)^2 G^k R_1 \varepsilon_1 \varepsilon(1-R) S_{S\text{-}out}^{k-1}(\omega) F_{RBS} \quad (1)$$

wherein $s_{L\text{-}out}^{k-1}$ represents a signal spectrum output in the k time of laser oscillation, $s_{S\text{-}out}^{k-1}(\omega)$ represents a distributed feedback signal fed back to the laser gain medium in the k−1 time, $F_{RBS}$ represents a distributed linewidth attenuation factor represented by Rayleigh scattering for signals injected each time, represented as:

$$F_{RBS} = A \frac{\omega^3}{|\omega^2 - \omega_0^2 + i\gamma\omega|^2} \quad (2)$$

Because it belongs to a linear scattering process, linewidth attenuation $F_{RBS}$ is a constant. During laser oscillation, the Rayleigh scattering unit compresses laser linewidth injected each time in a certain proportion and then feeds back to the gain unit to be amplified. Linewidth will be deeply compressed when laser reaches dynamic balance.

It should be noted that: the distributed scattering feedback unit is a material with high scattering coefficient integrated on a laser chip, and it may be optical fiber and gas material with high scattering coefficient or scattering waveguide written on a chip by utilizing a femtosecond processing technology. Laser wavebands that should be possessed by the gain medium of the laser generating gain unit may cover any waveband of laser, and in the present invention, there is no selectivity on wavelength in laser linewidth deep compression and mode. The optical elements may be connected by optical fiber, or may be connected by space coupling. Moreover, whether the laser gain unit is of a semiconductor type or an optical fiber laser gain type, laser output linewidth can be compressed to Hz magnitude by adopting the method.

Figure 5:
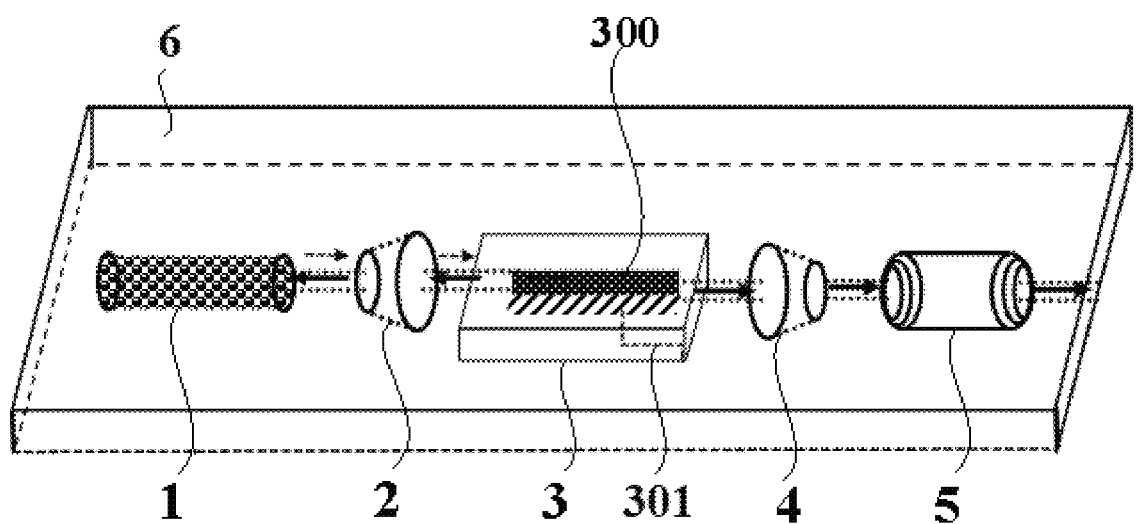
FIG. 5 is a schematic structure diagram of embodiment 1.

In embodiment 1, as shown in FIG. 5, the on-chip ultra-narrow linewidth laser includes a laser generating gain unit 3, a distributed scattering feedback unit 1, a first light collimating lens 2 and a second light collimating lens 4, wherein the first output terminal of the laser generating gain unit 3 is connected to the first terminal of the distributed scattering feedback unit 1 through the first light collimating lens 2, and the second output terminal of the laser generating gain unit 3 is connected to the first terminal of the second light collimating lens 4; and the laser generating gain unit 3 is used for generating a broad-spectrum initial optical signal and performing wavelength filtering on the generated optical signal, so as to obtain an optical signal with specific wavelength. In the present embodiment, a semiconductor type laser gain unit is adopted, and therefore, optical signal filtering is implemented depending on FBG.

One portion of the screened-out optical signal with specific wavelength is transmitted to the first terminal of the distributed scattering feedback unit 1 by the first light collimating lens 2, and the other portion is output by the second light collimating lens 4; the first terminal of the distributed scattering feedback unit 1 performs linewidth compression on the optical signal after receiving the optical signal with specific wavelength, and transmits the optical signal fed back backward after linewidth compression to the laser generating gain unit 3 by the first light collimating lens 2, the laser generating gain unit 3 performs gain amplification on the feedback optical signal after receiving the feedback optical signal, one portion of the optical signal after gain amplification is output by the second light collimating lens 4, and the other portion is transmitted to the first terminal of the distributed scattering feedback unit 1 again by the first light collimating lens 2 for further linewidth compression; and when reaching a steady state, after the optical signal with specific wavelength is subjected to cyclic linewidth compression by the distributed scattering feedback unit 1, an obtained single-longitudinal mode ultra-narrow linewidth optical signal is output from the second light collimating lens 4. The laser generating gain unit, the distributed scattering feedback unit, the first light collimating lens and the second light collimating lens are integrated on a baseplate, and thus realizing integration of a laser and reducing the volume.

In the present embodiment, the second terminal of the second light collimating lens 4 is connected to a first optical isolator 5, so as to achieve stable single-terminal output of the single-longitudinal mode ultra-narrow linewidth optical signal.

Figure 6:
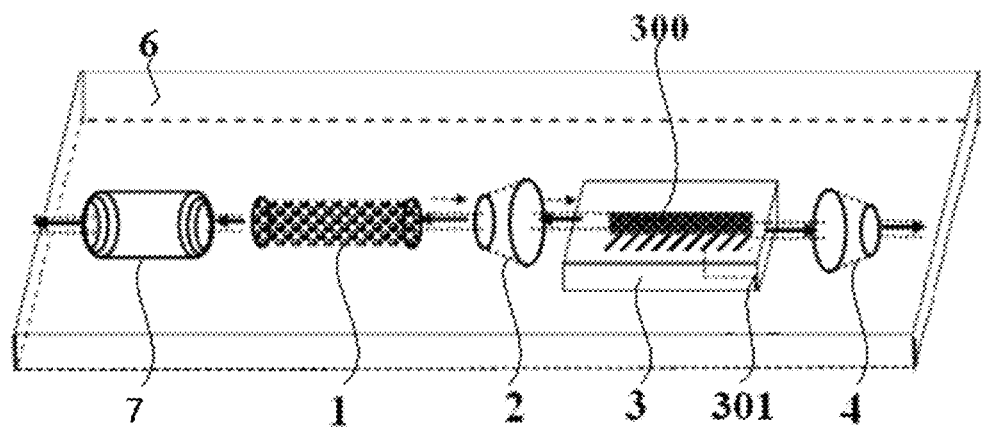
FIG. 6 is a schematic structure diagram of embodiment 2.

In embodiment 2, as shown in FIG. 6, the difference from embodiment 1 is that the second terminal of the distributed scattering feedback unit 1 is connected to a second optical isolator 7, which can also achieve stable single-terminal output of the single-longitudinal mode ultra-narrow linewidth optical signal.

In embodiment 3, the second terminal of the second light collimating lens 4 is connected to the first optical isolator 5, and the second terminal of the distributed scattering feedback unit 1 is connected to the second optical isolator 7, so as to achieve stable double-terminal output of the single-longitudinal mode ultra-narrow linewidth optical signal.

In addition, the optical fiber type laser gain unit and the semiconductor type laser gain unit may be randomly matched with the optical fiber based distributed scattering feedback unit and the integrated waveguide based distributed scattering feedback unit, that is, the optical fiber type laser gain unit-the optical fiber based distributed scattering feedback unit, the optical fiber type laser gain unit-the integrated waveguide based distributed scattering feedback unit, the semiconductor type laser gain unit-the optical fiber based distributed scattering feedback unit, and the semiconductor type laser gain unit-the integrated waveguide based distributed scattering feedback unit may all be implemented.

Figure 11:
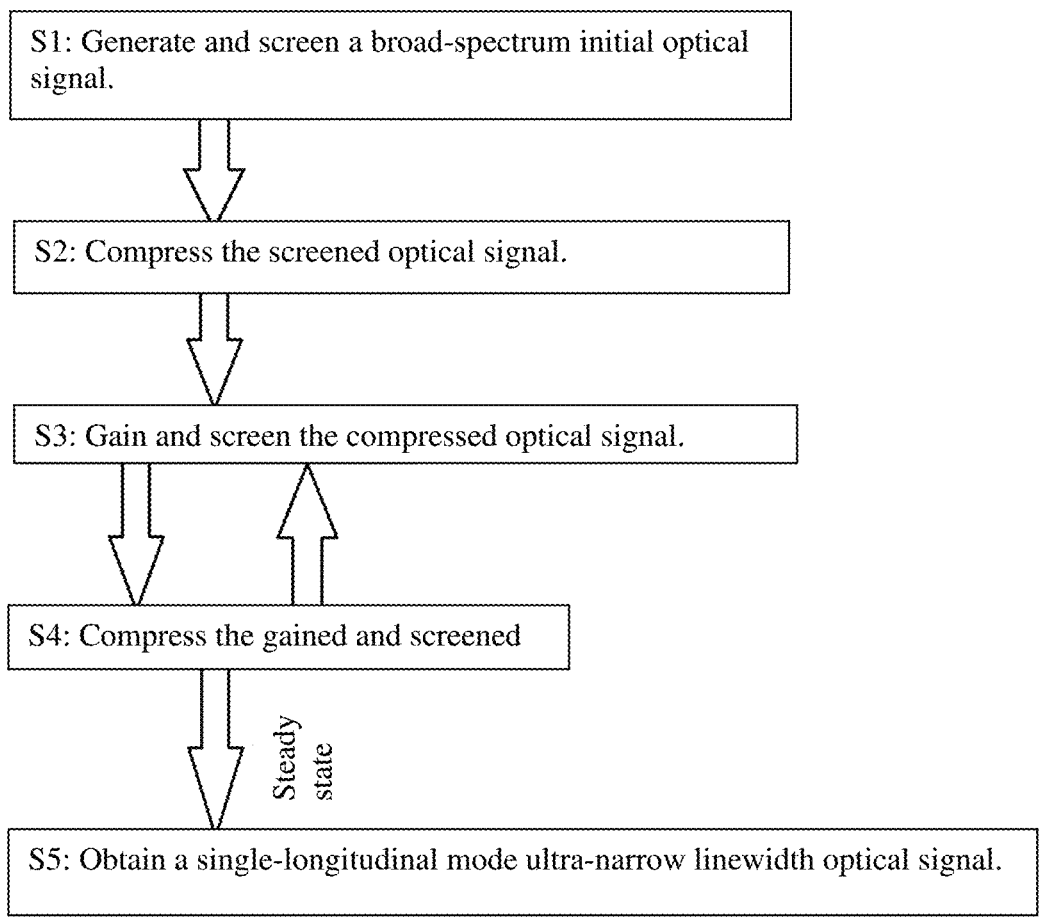
FIG. 11 is a flow diagram of the present invention.

The present invention also provides a method for obtaining a single-longitudinal mode ultra-narrow linewidth optical signal, which can stably obtain a single-longitudinal mode ultra-narrow linewidth optical signal, as shown in FIG. 11, including the following steps:

S1: generating a broad-spectrum initial optical signal and performing wavelength filtering on the generated optical signal to obtain an optical signal with specific wavelength; exciting optical fiber by the pump light source to generate an optical signal, and filtering the optical signal by setting a resonant cavity greater than gain linewidth; or exciting a semiconductor by an electrical signal to generate an optical signal, and engraving the semiconductor with FBG to screen the optical signal;

S2: performing linewidth compression on the optical signal with specific wavelength; scattering the optical signal by optical fiber with scattering characteristics to form an optical signal with narrower linewidth to achieve linewidth compression; or scattering the optical signal by an integrated waveguide component to form an optical signal with narrower linewidth to achieve linewidth compression;

S3: performing gain amplification on the compressed optical signal; transmitting at least one portion of the compressed optical signal to the gain medium of the laser generating gain unit by the distributed scattering feedback unit to perform gain amplification;

S4: performing linewidth compression on the optical signal after gain amplification once again; transmitting the optical signal after gain amplification to the distributed scattering feedback unit by the laser generating gain unit to perform linewidth compression gain; and S5: repeating steps S3-S4 until reaching a steady state, so as to obtain a single-longitudinal mode ultra-narrow linewidth optical signal.

In order to verify the compressing effect of the laser in the present invention to an optical signal, laser linewidth is represented by adopting a method of measuring a beat frequency between two lasers.

Figure 7:
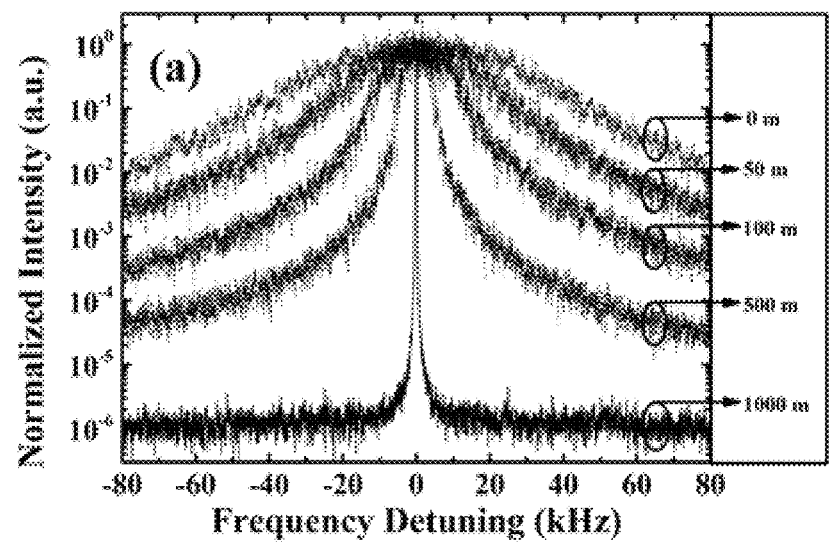
FIG. 7 is a beat frequency spectrogram collected under optical fibers of different lengths.
Figure 8:
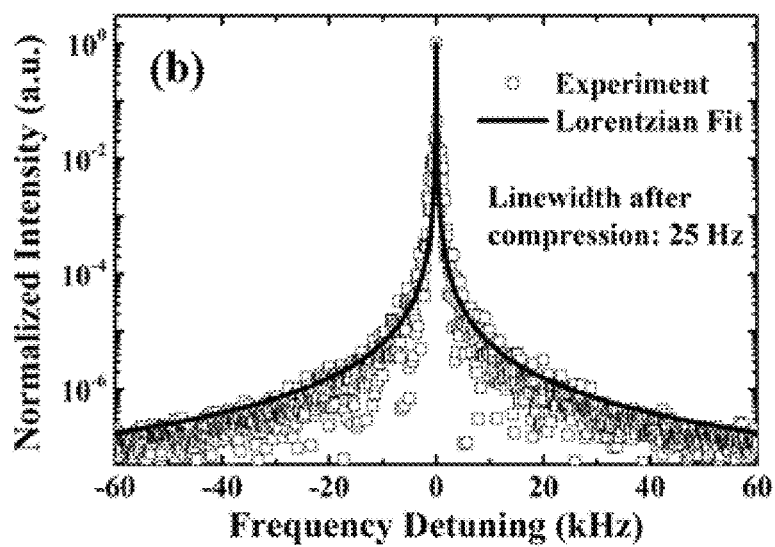
FIG. 8 is a beat frequency spectrogram collected when the length of optical fiber is 3L0.

Firstly, two on-chip ultra-narrow linewidth lasers are constructed, which are DFB semiconductors achieving linewidth compression based on distributed feedback, optical fibers of distributed scattering feedback units of the two lasers are of the same length, then beat frequency signals are collected by adopting a high-speed collecting card with bandwidth of 500 MHz and sampling frequency of 1.25 GHz, a frequency spectra of the obtained beat frequency signals is as shown in FIG. 7, and the highest curve in FIG. 7 represents the beat frequency spectra of the DFB lasers without linewidth compression, meanwhile, in the present embodiment, standard optical fiber length L0 is set as a reference feedback length. When the optical fiber length is adjusted to be 50 m, 100 m, 500 m and 1000 m, the collected beat frequency spectra are respectively shown by curves in FIG. 7, and it may be known from FIG. 7 that laser linewidth is gradually compressed to be narrower along with increase of optical fiber length, and when the optical fiber length reaches 3L0, laser linewidth lower than 100 Hz can be observed, as shown by a relation diagram between Lorentz linewidth and optical fiber length shown in FIG. 8, and the 3 dB bandwidth of the beat frequency spectrum is 50 Hz, meaning that the 3 dB linewidth of a single laser is compressed into 25 Hz.

Figure 9:
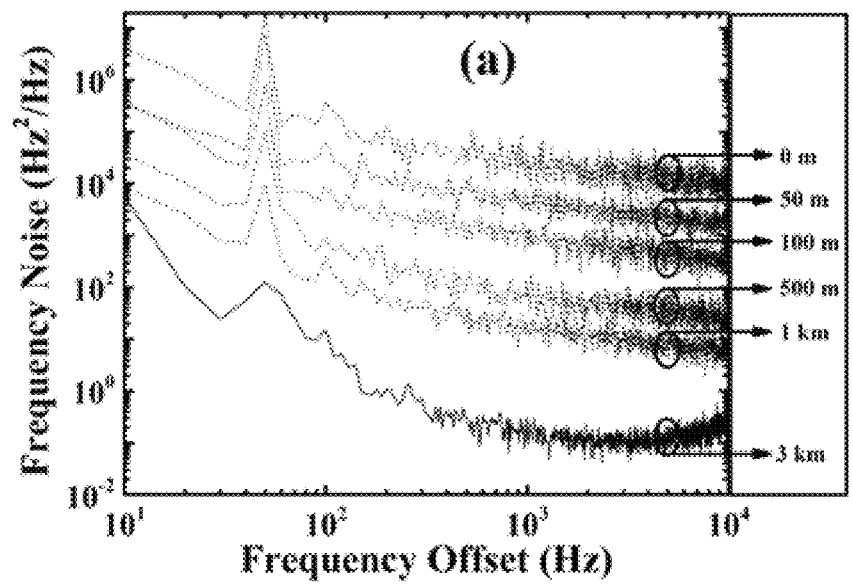
FIG. 9 is a beat frequency noise spectrogram collected under optical fibers of different lengths.
Figure 10:
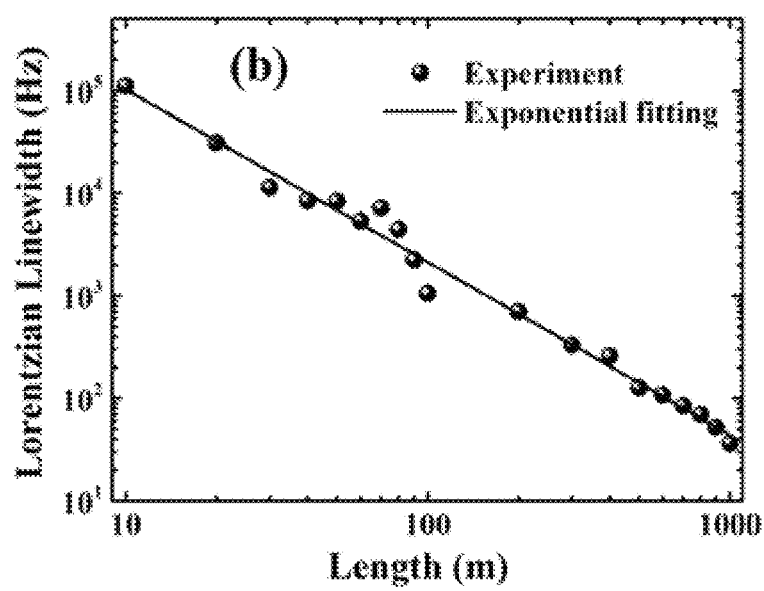
FIG. 10 is a schematic relation diagram of Lorentz linewidth and feedback length.

Further, the frequency noise and Lorentz linewidth of the laser are measured based on the above-mentioned beat frequency time domain signal, and the phase of the beat frequency signal is demodulated, so as to obtain the instantaneous frequency of the beat frequency signal, and then the demodulated instantaneous frequency is subjected to frequency noise spectral analysis by fast Fourier transform (FFT); along with increase of optical fiber length, beat frequency noise spectrum is as shown in FIG. 9, and on the basis of frequency noise spectrum density at the 10 kHz frequency offset, in the present embodiment, the Lorentz linewidth of the laser is computed, with the result as shown in FIG. 10, and it may be seen that along with the lengthening of optical fiber, the overall laser frequency noise is reduced by over 5 orders of magnitude; and in the condition of reference feedback length, Lorentz linewidth is as narrow as 30 Hz, which is compressed by over 3 orders of magnitude. The laser Lorentz linewidth with different optical fiber lengths is summarized as in table 1:

TABLE 1

Statistical Table of the Laser Lorentz Linewidth with Different Optical Fiber Lengths

| Feedback Length (m) | Lorentzian Linewidth (Hz) |
|---|---|
| 0 | 170087 |
| 10 | 110558 |
| 20 | 31087 |
| 30 | 11300 |
| 40 | 8397.1 |
| 50 | 8331.5 |
| 60 | 5352.5 |
| 70 | 7170 |
| 80 | 4423.6 |
| 90 | 2242.4 |
| 100 | 1052.3 |
| 200 | 697.92 |
| 300 | 329.49 |
| 400 | 258.23 |
| 500 | 126.12 |
| 600 | 108.26 |
| 700 | 84.231 |
| 800 | 69.458 |
| 900 | 52.096 |
| 1000 | 36.127 |

Persons skilled in the art may easily think of other implementation schemes of the present invention after considering the specification and practicing the invention disclosed herein. The present application is aimed at covering any variation, purposes or adaptive changes of the present invention, and these variations, purposes or adaptive changes abide by the general principle of the present invention and include common general knowledge or usual technological means in the technical field undisclosed in the present invention. The specification and embodiments are only regarded as being exemplary, and the true scope and spirit of the present invention are indicated in the accompanying claims.

It should be understood that the present invention is not limited to the foregoing described precise structure shown in the accompanying drawings, and various alteration and changes may be made without departing from the scope. The scope of the present invention is limited by the accompanying claims.

What is claimed is:

1. An on-chip ultra-narrow linewidth laser, comprising:
a laser generating gain unit (3) comprising a pump source (201) for generating a broad-spectrum initial optical signal, a filter for performing wavelength filtering on the generated optical signal, a first output terminal and a second output terminal;
a distributed scattering feedback unit (1) having a first terminal and a second terminal for performing linewidth compression on the optical signal;
a first light collimating lens (2); and
a second light collimating lens (4), wherein:
the distributed scattering feedback unit (1) includes a light guide component with scattering characteristics and a shielding component wrapping the light guide component so that the optical signal propagates in a predetermined direction in the light guide component;
the laser generating gain unit (3) is connected with the distributed scattering feedback unit (1), so that the optical signal generated by the laser generating gain unit (3) is subjected to wavelength filtering through the filter and then output to the light guide component of the distributed scattering feedback unit (1) to scatter to form an optical signal with a narrower linewidth to achieve linewidth compression;

the optical signal which returns along the original path and is fed back to the optical signal of the laser generating gain unit (3) is subjected to gain amplification and wavelength filtering once again, repeating until achieving a steady state so as to obtain a single-longitudinal mode ultra-narrow linewidth optical signal;

the distributed scattering feedback unit (1) is an integrated waveguide component with a scattering mechanism;

the integrated waveguide component includes a substrate (111);

the substrate (111) is covered with a dielectric film (112) and a covering layer (113) from bottom to top;

the refractive indexes of the dielectric film (112), the substrate (111) and the covering layer (113) are sequentially reduced;

the first output terminal of the laser generating gain unit (3) is connected to the first terminal of the distributed scattering feedback unit (1) through the first light collimating lens (2);

the second output terminal of the laser generating gain unit (3) is connected to a first terminal of the second light collimating lens (4);

a second terminal of the second light collimating lens (4) is connected to a first optical isolator (5); and the second terminal of the distributed scattering feedback unit (1) is connected to a second optical isolator (7).

2. The on-chip ultra-narrow linewidth laser in claim 1, wherein the substrate (111) is a silicon substrate or gallium arsenide.

3. The on-chip ultra-narrow linewidth laser in claim 1, wherein:
the laser generating gain unit (3) includes the pump source (201), a resonant cavity and a gain medium (300); and
the gain medium (300) is arranged within the resonant cavity.

4. The on-chip ultra-narrow linewidth laser in claim 3, wherein:
the resonant cavity includes a first reflector (202) and a second reflector (203); the first reflector (202) and the second reflector (203) are parallel to each other and are corresponding in position; and
the gain medium (300) is arranged between the first reflector (202) and the second reflector (203).

5. The on-chip ultra-narrow linewidth laser in claim 4, wherein:
the gain medium (300) is optical fiber doped with rare earth elements; and
the rare earth element is $Er^{+3}$ or $Yi^+$.

6. The on-chip ultra-narrow linewidth laser in claim 4, wherein:
the pump source (201) is a pump light source; and
an optical signal emitted by the pump light source is perpendicular to the first reflector (202) and the second reflector (203).

7. The on-chip ultra-narrow linewidth laser in claim 6, wherein an interval between the first reflector (202) and the second reflector (203) is greater than a gain bandwidth provided by the gain medium (300).

8. The on-chip ultra-narrow linewidth laser in claim 4, wherein:
the gain medium (300) is a semiconductor gain unit;
the semiconductor gain unit includes a P-type layer (211), a P-N-type layer (212) and an N-type layer (213) from top to bottom;
the P-type layer (211) is connected to the positive electrode of the pump source (201);
the N-type layer (213) is connected to the negative electrode of the pump source (201); and
the semiconductor gain unit is made of one of gallium arsenide, cadmium sulfide, indium phosphide and zinc sulfide by adopting a doping method.

9. The on-chip ultra-narrow linewidth laser in claim 8, wherein the gain medium (300) is linear; and
a fiber Bragg grating (301) is engraved on the underside of the gain medium (300).

10. The on-chip ultra-narrow linewidth laser in claim 1, wherein the laser generating gain unit (3), the distributed scattering feedback unit (1), the first light collimating lens (2) and the second light collimating lens (4) are integrated on a baseplate.

11. A method for obtaining a single-longitudinal mode ultra-narrow linewidth optical signal, comprising the steps of:
S1: generating a broad-spectrum initial optical signal and performing wavelength filtering on the generated optical signal;
S2: performing linewidth compression on the filtered optical signal;
S3: performing gain amplification and filtering on the compressed optical signal;
S4: performing linewidth compression on the optical signal after gain amplification and filtering once again; and
S5: repeating steps S3-S4 until reaching a steady state to obtain a single-longitudinal mode ultra-narrow linewidth optical signal.

12. The method for obtaining a single-longitudinal mode ultra-narrow linewidth optical signal in claim 11, wherein, in S1:
a pump light source excites an optical fiber to generate the optical signal, and a resonant cavity greater than the gain bandwidth is set to filter the optical signal; or
an electrical signal excites a semiconductor to generate an optical signal, and the semiconductor is engraved with a fiber Bragg grating to filter the optical signal.

13. The method for obtaining a single-longitudinal mode ultra-narrow linewidth optical signal in claim 11, wherein in S2:
an optical fiber with scattering characteristics scatters the optical signal to form an optical signal with narrower linewidth to achieve linewidth compression; or
an integrated waveguide component scatters the optical signal to form an optical signal with narrower linewidth to achieve linewidth compression.

14. The on-chip ultra-narrow linewidth laser in claim 1, wherein:
the distributed scattering feedback unit is an integrated waveguide component with scattering characteristics; and
the integrated waveguide component includes a light guide component and a shielding component.

* * * * *